US012580017B2

(12) United States Patent
Qin et al.

(10) Patent No.: US 12,580,017 B2
(45) Date of Patent: Mar. 17, 2026

(54) CHANNEL CIRCUIT WITH TRAINED NEURAL NETWORK NOISE MIXTURE ESTIMATOR

(71) Applicant: Western Digital Technologies, Inc., San Jose, CA (US)

(72) Inventors: Minghai Qin, Fremont, CA (US); Chao Sun, San Jose, CA (US); Dejan Vucinic, San Jose, CA (US); Henry Yip, Bellflower, CA (US); Jonas Goode, Lake Forest, CA (US); Richard Galbraith, Rochester, MN (US); Iouri Oboukhov, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 335 days.

(21) Appl. No.: 18/354,178

(22) Filed: Jul. 18, 2023

(65) Prior Publication Data

US 2024/0170056 A1      May 23, 2024

Related U.S. Application Data

(60) Provisional application No. 63/384,532, filed on Nov. 21, 2022.

(51) Int. Cl.
G11C 11/54          (2006.01)
G11C 11/416          (2006.01)
(52) U.S. Cl.
CPC ............ G11C 11/54 (2013.01); G11C 11/416 (2013.01)
(58) Field of Classification Search
CPC ......... G11C 11/54; G11C 11/416; G06N 3/08; G06N 3/084; G11B 20/10046

USPC .................................................. 365/189.011
See application file for complete search history.

(56) References Cited

U.S. PATENT DOCUMENTS

| | | | |
|---|---|---|---|
| 10,924,304 B2 | 2/2021 | Shen | |
| 2020/0389188 A1 | 12/2020 | Belzer | |
| 2023/0260502 A1* | 8/2023 | Gabrys | G10L 19/16 |
| | | | 704/260 |

FOREIGN PATENT DOCUMENTS

EP          3690883 A1      8/2020

OTHER PUBLICATIONS

Matcha et al., "Generalized Partial Response Equalization and Data-Dependent Noise Predictive Signal Detection Over Media Models for TDMR," IEEE Transactions on Magnetics, Bengaluru, India, vol. 51, No. 10, pp. 1-15, Oct. 2015.

(Continued)

*Primary Examiner* — Fernando Hidalgo
(74) *Attorney, Agent, or Firm* — Patent Law Works LLP

(57)          ABSTRACT

Example channel circuits, data storage devices, and methods for using a trained neural network to estimate the noise mixture in a read signal are described. Samples are determined from a digital read signal, such as the read signal from the non-volatile storage medium of a data storage device. The samples are processed through one or more instances of a neural network comprised of trained coefficients and outputting a set of estimate values for a noise mixture of the read signal. The set of estimate values may then be used to adjust parameters of the read channel for processing the read signal to detect and decode data.

20 Claims, 6 Drawing Sheets

(56) References Cited

OTHER PUBLICATIONS

Ng et al., "Signal Processing for Bit-Patterned Media and Heat-Assisted Magnetic Recording Systems with Media Noise," Dissertation for the Department of Electrical And Computer Engineering at Carnegie Mellon University, Pittsburgh, PA, Jul. 2012.

Qin et al., "Deep Neural Network—Data Detection Channel for Hard Disk Drives by Learning," IEEE Transactions on Magnetics, vol. 56, Issue: 2, p. 1, Feb. 2020.

Sayyafan et al., "Deep Neural Network Based Media Noise Predictors for Use in High-Density Magnetic Recording Turbo-Detectors," IEEE Transactions on Magnetics, pp. 1-6, Feb. 2020.

Shen et al., "Convolutional Neural Network Based Symbol Detector for Two-Dimensional Magnetic Recording," IEEE Transactions on Magnetics, vol. 57, No. 3, pp. 1-5, Mar. 2021.

* cited by examiner

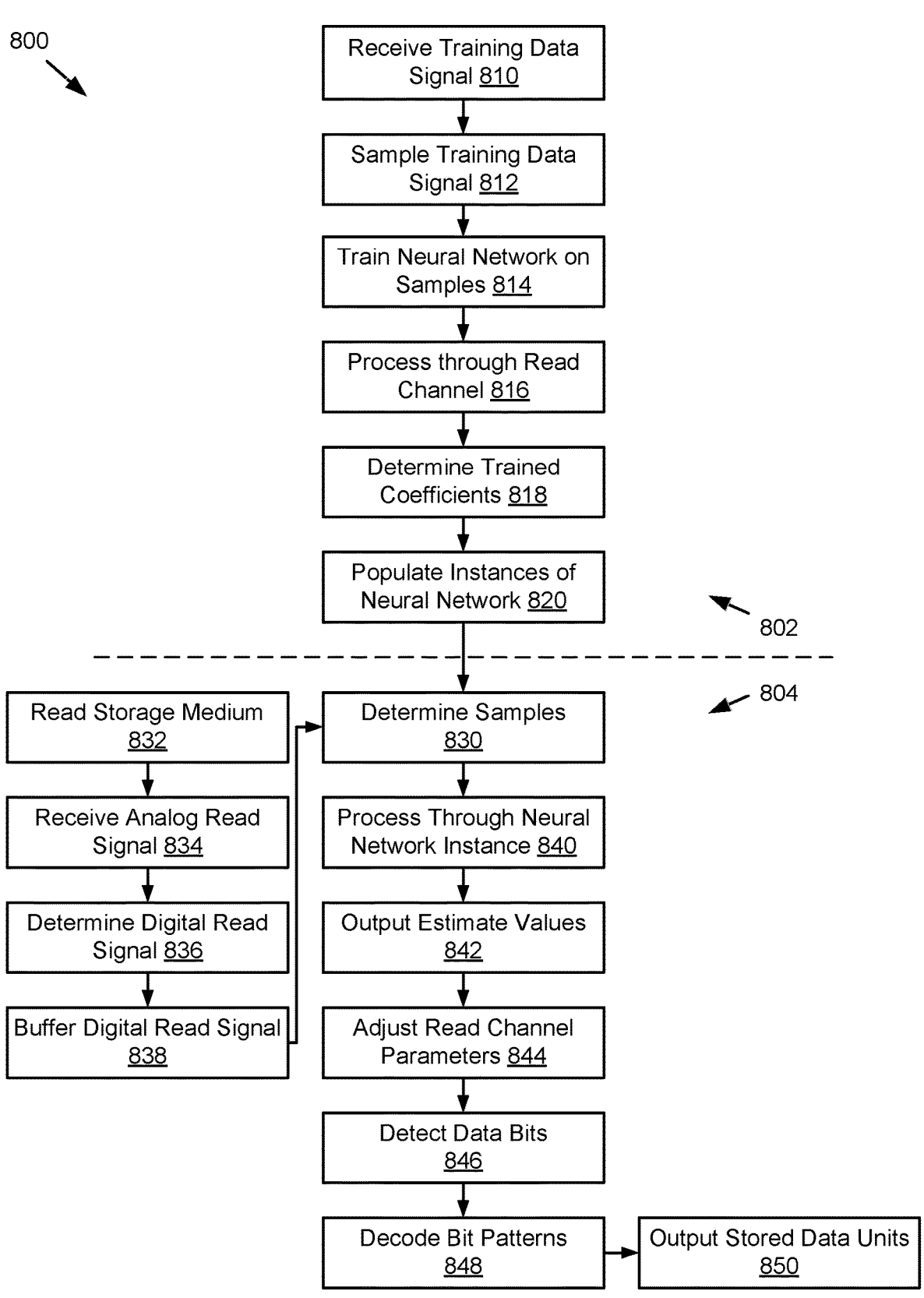

800

Receive Training Data Signal 810

Sample Training Data Signal 812

Train Neural Network on Samples 814

Process through Read Channel 816

Determine Trained Coefficients 818

Populate Instances of Neural Network 820

802

804

Read Storage Medium 832

Determine Samples 830

Receive Analog Read Signal 834

Process Through Neural Network Instance 840

Determine Digital Read Signal 836

Output Estimate Values 842

Buffer Digital Read Signal 838

Adjust Read Channel Parameters 844

Detect Data Bits 846

Decode Bit Patterns 848

Output Stored Data Units 850

FIG. 8

CHANNEL CIRCUIT WITH TRAINED NEURAL NETWORK NOISE MIXTURE ESTIMATOR

TECHNICAL FIELD

The present disclosure relates to read/write channel circuits for data storage devices. In particular, the present disclosure relates to read/write channels using a noise mixture estimator based on a trained neural network.

BACKGROUND

Data storage devices such as hard disk drives comprise a magnetic disk and a head connected to a distal end of an actuator arm which is rotated about a pivot by a voice coil motor (VCM) to position the head radially over the disk. The disk comprises a plurality of radially spaced tracks for recording user data sectors and servo sectors. The servo sectors comprise head positioning information (e.g., a track address) which is read by the head and processed by a servo control system to control the actuator arm as it seeks from track to track. The magnetic disk acts as a non-volatile storage medium for storing data.

FIG. 1 shows a prior art disk format 2 as comprising a number of servo tracks 4 defined by servo sectors $6_0$-$6_N$ recorded around the circumference of each servo track. In some configurations, each servo sector comprises a preamble for storing a periodic pattern, which allows proper gain adjustment and timing synchronization of the read signal, and a sync mark for storing a special pattern used to symbol synchronize to a servo data field. The servo data field stores coarse head positioning information, such as a servo track address, used to position the head over a target data track during a seek operation. Each servo sector $6_i$ further comprises groups of servo bursts (e.g., N and Q servo bursts), which are recorded with a predetermined phase relative to one another and relative to the servo track centerlines. The phase-based servo bursts provide fine head position information used for centerline tracking while accessing a data track during write/read operations.

FIG. 2 shows a prior art mechanical configuration for a hard disk drive (HDD) 200 comprising a spindle 202 that holds a plurality of platters 204. Each platter 204 has at least one magnetic surface 206, such as a magnetic surface formatted similarly to disk format 2 in FIG. 1. Magnetic surface 206 may be configured to have digitally encoded data stored thereon as magnetized domains. A head 208 may be mounted at the end of an arm 210 controlled by an actuator 212. A read element 214 may be configured to detect magnetized portions of magnetic surface 206 and generate an analog read signal. A write element 216 may be configured to generate a timed write field to write (or erase) magnetized portions of magnetic surface 206 using an analog write signal. In some configurations, head 208 may include more than one read element 214 and/or write element 216 and HDD 200 may include multiple heads 208, arms 210, and/or actuators 212. A preamplifier (preamp or preamplifier circuit) 218 controls the read and write signals to the corresponding read and write elements (e.g., read element 214 and write element 216) of each head (e.g., head 208). Preamplifier 218 may be attached to a flex circuit 220 that provides a data and power bus connection to a printed circuit board (not shown) with other drive control circuitry, such as a disk drive controller, through a flex interface connector 222.

The disk drive controller may include a read/write channel configured to receive an analog read signal from read element 214 through preamplifier 218 and flex circuit 220. The channel or channel circuit may convert the analog read signal to a digital read signal and perform iterative data detection and decoding to recover the data previously stored to disk surface 206. In some configurations, the channel may be configured to perform data detection and decoding on a plurality of data sectors corresponding to a data track. The channel may return detected data units corresponding to data bit representations in the analog read signal. These data units may be passed from the channel to a host interface. In some embodiments, the storage device controller may include a processor, memory, firmware, and other resources for receiving the data units from the channel, providing those data units to the host (with or without additional processing), and otherwise managing and coordinating the various storage device functions and subsystems.

The data channel may include various parameters for compensating for variations in read signals that impact data detection and decoding. For example, a read signal may include a variety of noise sources that make reliable bit detection and data decoding more difficult and noise offset parameters may be used to adjust the data signal for improved processing. Prior noise correction may be based on noise breakdown characterization using multiple writes and reads of the same data, such as repeated writes and reads of a data sector. While such an approach may provide accurate noise components, it uses special operations that are not practical for real-time adjustment of noise offset parameters during normal drive operation.

Technology for real-time noise estimation from samples determined during normal operation may be needed. A data channel that uses a trained deep neural network to process samples from data as it is read and determine the noise mixture may be advantageous.

SUMMARY

Various aspects for channel circuits with trained neural network noise estimators are described, particularly read channels configured to use samples from the read signal to determine the noise mixture and adjust read channel parameters for real-time compensation, such as on a per data sector basis.

One general aspect includes a channel circuit that includes: an interval selector configured to determine at least one sample from a digital read signal; a trained noise estimator configured to process the at least one sample through an instance of a neural network comprised of trained coefficients, and output a set of estimate values corresponding to a noise mixture in the digital read signal; and adjustment logic configured to adjust at least one parameter of a read channel based on the set of estimate values.

Implementations may include one or more of the following features. The set of estimate values may include estimate values for a plurality of noise types selected from jitter, electronic noise, and color noise. The set of estimate values may include a jitter value, an electronic noise value, and a color noise value and combination of the jitter value, the electronic noise value, and the color noise value may correspond to a total noise value. The channel circuit may include an analog-to-digital converter configured to: receive an analog read signal determined from a non-volatile storage medium; determine the digital read signal from the analog read signal; and buffer the digital read signal to a buffer memory, where the interval selector determines the at least one sample from the buffer memory. The at least one sample determined by the interval selector may include a plurality of samples; each sample of the plurality of samples may be configured with a sample size and a sample interval from the digital read signal; the trained noise estimator may include a plurality of instances of the neural network: each sample of the plurality of samples may be processed through a different instance of the plurality of instances of the neural network; and the set of estimate values may be based on outputs from the plurality of samples and the plurality of instances of the neural network. The channel circuit may include estimate combination logic configured to: receive a corresponding set of estimate values from each sample of the plurality of samples; and determine, based on the corresponding sets of estimate values, the set of estimate values provided to the adjustment logic. The channel circuit may include an iterative detector configured to: detect data bits from the digital read signal; and decode detected bit patterns to determine data units stored to a non-volatile storage medium, where the at least one parameter of the read channel is configured to adjust values in the digital read signal for processing by the iterative detector. The interval selector may be further configured to determine the at least one sample for a predefined adjustment interval; the adjustment logic may be further configured to adjust the at least one parameter of the read channel during the predefined adjustment interval; and the predefined adjustment interval may be each data sector of a non-volatile storage medium. The channel circuit may include estimator training logic configured to: receive a training data signal may include of known noise components and known data components; sample the training data signal to determine a set of training samples; and process, using the read channel and a neural network trainer, the set of training samples to determine the trained coefficients by separating a plurality of noise components from data components in the set of training samples. A data storage device may include the channel circuit and may include a non-volatile storage medium configured to store data.

Another general aspect includes a method that includes: determining at least one sample from a digital read signal; processing the at least one sample through an instance of a neural network may include of trained coefficients; outputting, from the instance of the neural network, a set of estimate values corresponding to a noise mixture in the digital read signal; and adjusting at least one parameter of a read channel based on the set of estimate values.

Implementations may include one or more of the following features. The set of estimate values may include estimate values for a plurality of noise types selected from jitter, electronic noise, and color noise. The set of estimate values may include a jitter value, an electronic noise value, and a color noise value, and combination of the jitter value, the electronic noise value, and the color noise value corresponds to a total noise value. The method may include: receiving, by an analog-to-digital converter, an analog read signal determined from a non-volatile storage medium; determining, by the analog-to-digital converter, the digital read signal from the analog read signal; buffering the digital read signal to a buffer memory; and determining the at least one sample from the buffer memory. The method may include determining a plurality of samples from the digital read signal, where each sample of the plurality of samples is configured with a sample size and a sample interval from the digital read signal; and processing each sample of the plurality of samples through a different instance of a plurality of instances of the neural network, where the set of estimate values are based on outputs from the plurality of samples and the plurality of instances of the neural network. The method may include: receiving a corresponding set of estimate values from each sample of the plurality of samples; and determining, based on the corresponding sets of estimate values, the set of estimate values used for adjusting the at least one parameter of the read channel. The method may include: detecting, by an iterative detector, data bits from the digital read signal; and decoding, by the iterative detector, detected bit patterns to determine data units stored in a non-volatile storage medium, where adjusting the at least one parameter of the read channel includes adjusting values in the digital read signal for processing by the iterative detector. The method may include: determining the at least one sample for a predefined adjustment interval; and adjusting the at least one parameter of the read channel during the predefined adjustment interval, where predefined adjustment interval is each data sector of a non-volatile storage medium. The method may include: receiving a training data signal may include of known noise components and known data components; sampling the training data signal to determine a set of training samples; and training, using the read channel and the set of training samples, the neural network to determine the trained coefficients for separating a plurality of noise components from data components in the set of training samples.

Still another general aspect includes a data storage device that includes: a non-volatile storage medium; a channel circuit including a read channel; means for determining at least one sample from a digital read signal; means for processing the at least one sample through an instance of a neural network may include of trained coefficients; means for outputting, from the instance of the neural network, a set of estimate values corresponding to a noise mixture in the digital read signal; and means for adjusting at least one parameter of the read channel based on the set of estimate values.

The present disclosure describes various aspects of innovative technology capable of improving manufacturing costs, performance, and/or error rates by supporting real-time adjustment of noise compensation parameters in the read channel based on one or more samples from the digital read signal. The various embodiments include operations and control circuitry to overcome or at least reduce issues previously encountered in data storage devices and, accordingly, are more efficient, reliable, and/or higher performance than other data storage devices. That is, the various embodiments disclosed herein include hardware and/or software with functionality to improve data storage device cost and performance, such as by using trained neural network noise mixture estimators to make real-time parameter adjustments in a read channel. Accordingly, the embodiments disclosed herein provide various improvements to data storage devices and computing systems incorporating such data storage devices.

BRIEF DESCRIPTION OF THE DRAWINGS

The techniques introduced herein are illustrated by way of example, and not by way of limitation, in the figures of the accompanying drawings in which like reference numerals are used to refer to similar elements.

FIG. 8 is an example method of training and using neural network noise mixture estimators to adjust a read channel.

DETAILED DESCRIPTION

Using a trained neural network to process samples from the read signal in a read channel may enable a real-time, single read estimate of the noise breakdown in a data storage device, such as a hard disk drive (HDD). More specifically, the noise mixture may be characterized by the trained neural network to output noise estimate values for different noise components or noise types, such as jitter, electronic noise, and color noise from the storage media. In some configurations, the set of noise estimate values may represent a total noise component (i.e., 100% of the noise in the signal) and may be expressed as percentages of a total noise value. The combined set of noise estimate values, such as a jitter value, an electronic noise value, and a color noise value, may equal the total noise component in the read signal.

Real-time, single read estimate may use one or more samples from a predefined interval to apply the resulting noise correction to that interval. For example, the predefined adjustment interval may be on a per sector or sector-by-sector basis and the samples may be taken from the initial portion of each data sector as it is read from the storage medium and received by the channel. The neural network may process the sample or samples for each sector to make a noise estimate inference for that data sector, which may then be mapped to a corresponding set of noise correction parameter adjustments for the mixture of noise types. Such dynamic optimization of the noise correction may improve detection performance, lower bit error rates, and drive improved areal density and/or margin in the data storage device.

Figure 1:
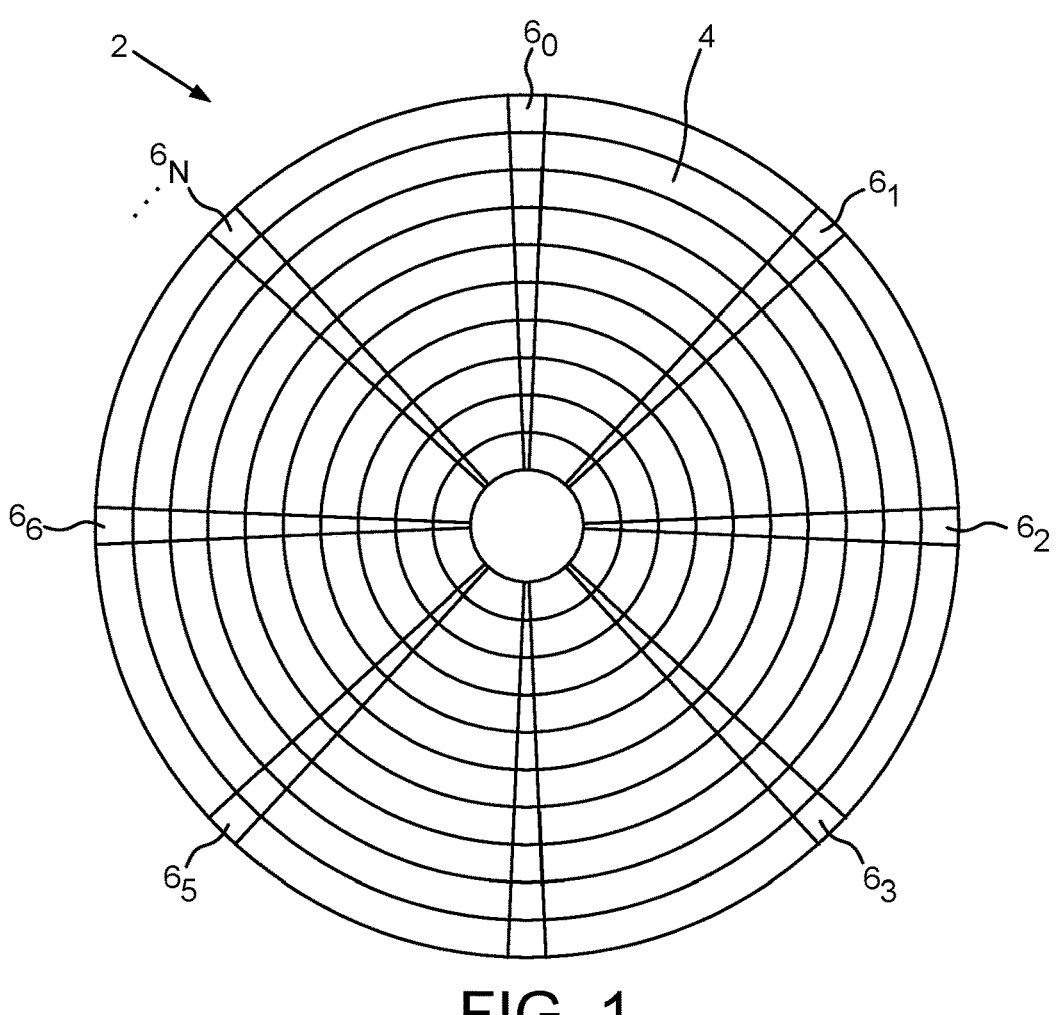
FIG. 1 is a diagram of a prior art disk format comprising a plurality of servo tracks defined by servo sectors.
Figure 2:
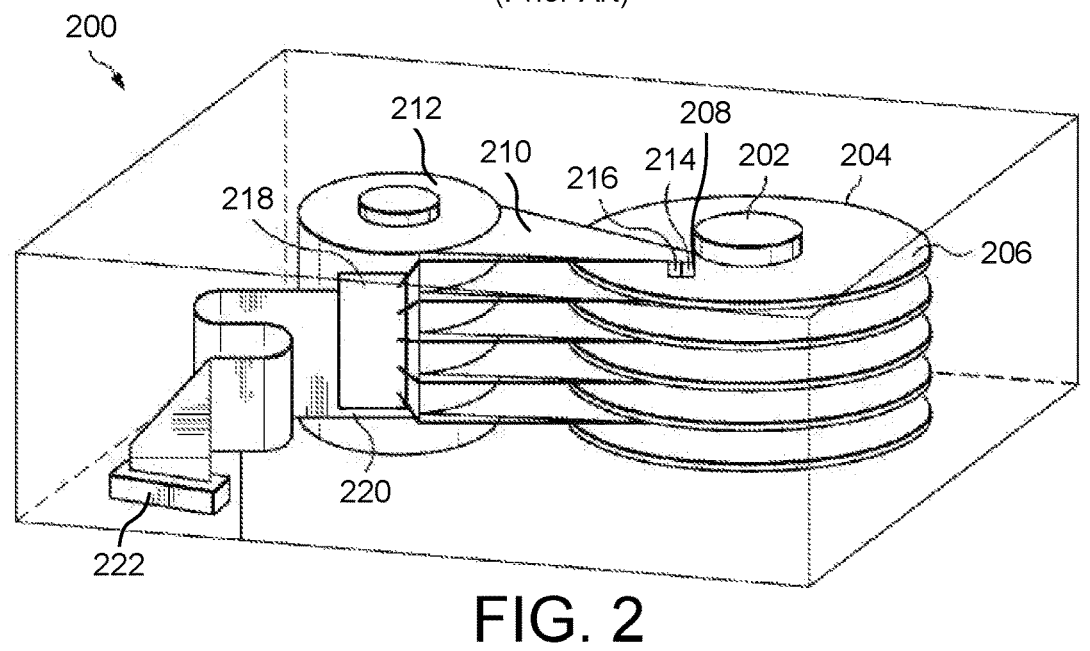
FIG. 2 is a diagram of an example data storage device in the form of a disk drive comprising heads actuated over disk surfaces.
Figure 3:
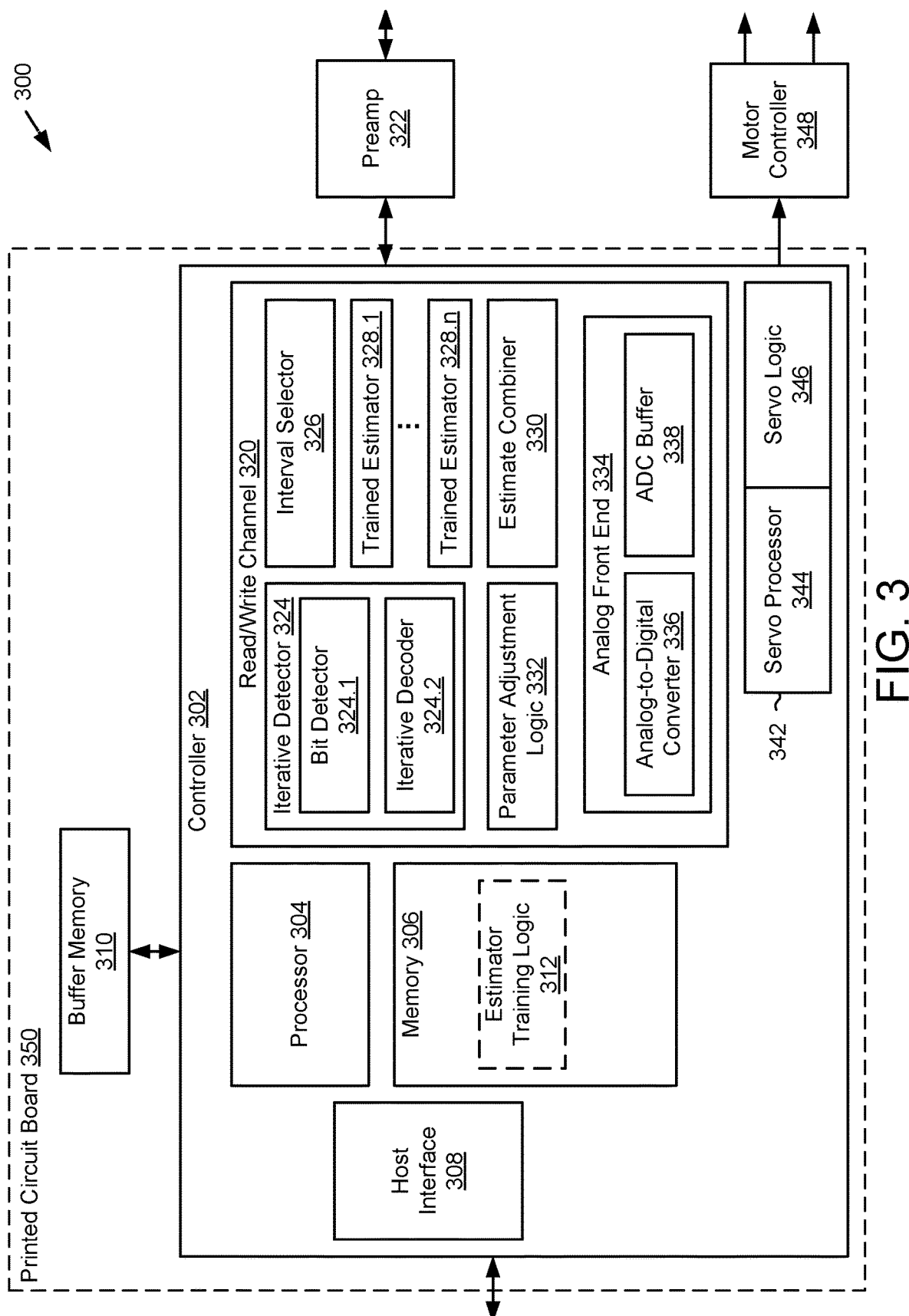
FIG. 3 is a block diagram of a configuration of data storage device electronics for a controller and read/write channel configured with trained neural network noise mixture estimators.

FIG. 3 shows a portion of example control circuitry 300 for a data storage device, such as a hard disk drive. In the example shown, control circuitry 300 may include one or more controllers. Controller 302 may comprise a storage device controller configured to receive host storage commands, process storage operations for writing, reading, and managing data stored to non-volatile storage media in the disk drive, such as the magnetic media disks in FIGS. 1 and 2. In some embodiments, controller 302 may correspond to a separate host interface and read/write path to a subset of disk surfaces in a data storage device with multiple controllers. In some embodiments, controller 302 may be configured to manage servo and read/write operations for one or more actuators, heads, and corresponding writer and reader elements.

Controller 302 may comprise a processor 304, a memory 306, a host interface 308, and access to a buffer memory 310. Controller 302 may also comprise a read/write channel 320, and a servo controller 342 including a servo processor 344 and servo logic 346. In some embodiments, one or more of host interface 308, read/write channel 320, and servo controller 342 may be embodied in separate packages, such as application specific integrated circuits (ASICs), systems on a chip (SOCs), or other specialized circuits that interface with processor 304 and memory 306 for carrying out their respective functions. Controller 302 may include physical and electrical interfaces for connecting to buffer memory 310, a power source (not shown), preamp 322, motor controller 348, other controllers, and/or other circuitry components. In some embodiments, the components of controller 302 may be interconnected by a bus that includes one or more conductors that permit communication among the components. For example, processor 304, memory 306, host interface 308, read/write channel 320, and/or servo controller 342 may be components attached to a printed circuit board assembly (PCBA) 350 that provides one or more layers of interconnect conductors among the components.

Processor 304 may include any type of conventional processor or microprocessor that interprets and executes instructions. Memory 306 may include a random access memory (RAM) or another type of dynamic storage device that stores information and instructions for execution by processor 304 and/or a read only memory (ROM) or another type of static storage device that stores static information and instructions for use by processor 304 and/or any suitable storage element, such as a system portion of a hard disk media or a solid state storage element. Memory 306 may be configured to store controller firmware, comprising instructions that include one or more modules or sub-modules for specific data storage device operations and processor 304 may execute those instructions, including controlling communication with other components, such as host interface 308, buffer memory 310, read/write channel 320, and servo controller 342. In some configurations, one or more features of host interface 308, buffer memory 310, read/write channel 320, and/or servo controller 342 may be embodied in firmware stored in memory 306 for execution by processor 304. In some configurations, memory 306 may be used to store one or more modules for execution during the manufacture and/or configuration of the storage device. For example, estimator training logic 312 may be used to train the neural network for trained estimators 328 during storage device manufacturing, but may not be present in memory 306 during normal operation of the device.

Host interface 308 may include any transceiver-like mechanism that enables the data storage device to communicate with other devices and/or systems, such as a host system for which the storage device provides data storage. Host interface 308 may comprise a host storage interface compliant with one or more storage interface standards, such as a Serial Advanced Technology Attachment (SATA) interface, a Small Computer System Interface (SCSI), serial attached SCSI (SAS), peripheral computer interface express (PCIe) (e.g., Non-Volatile Memory Express (NVMe)), etc., for connecting host interface 308 to peripheral interface or network port.

Buffer memory 310 may include a RAM, flash, or another type of dynamic storage device for storing host data and other information in transit between the storage media of the storage device and the host (via host interface 308). In some embodiments, buffer memory 310 is a separate memory device from memory 306 and the disk surfaces or other non-volatile memory of the data storage device.

Read/write channel 320 may include one or more specialized circuits configured for processing binary data to be written to the disk surfaces using an analog write signal and processing the analog read signal from the disk surfaces back into binary data. For example, read/write channel 320 may include a write path or write channel comprised of various data scramblers, run-length limited (RLL) encoders, iterative error correction code (ECC) encoders, precompensation circuits, and other data or signal processing components. Read/write channel 320 may include a read path or read channel comprised of various amplifiers, filters, equalizers, analog-to-digital converters (ADCs), soft information detectors, iterative ECC decoders, and other data or signal processing components. The write channel components may comprise a write channel circuit and the read channel components may comprise a read channel circuit, though the circuits may share some components. Read/write channel 320 may provide the analog write signal to and receive the analog read signal from preamp 322, which controls and amplifies signals to and from the heads. Binary data for recording to the storage medium may be received by read/write channel 320 from controller firmware and decoded data from read/write channel 320 may be passed to controller firmware and/or directed to buffer memory 310 for communication to the host.

In some configurations, read/write channel 320 may include an analog front end 334 configured to receive the analog read signal from preamp 322 and convert it into a digital read signal for processing by other components of read/write channel 320. For example, analog front end 334 may include an ADC 336 that receives an analog data signal from preamp 322 and generates a digital signal for use by other components of read/write channel 320. ADC 336 may sample the analog read signal at a predefined channel baud rate to determine digital signal values corresponding to a digital read signal waveform. In some configurations, analog front end 334 may include an ADC buffer memory 338 configured to temporarily store the digital read signal generated by the ADC before it passed to other components, such as an equalization circuit in the read path to iterative detector 324. For example, ADC buffer 338 may include a set of volatile memory locations for buffering a portion of the digital read signal, such as a number of baud rate samples corresponding to a data sector or a portion thereof. ADC buffer 338 may hold digital read signal data before or concurrent with moving it into iterative detector 324 along the read path. In some configurations, other processes or modules may use the data from ADC buffer 338. For example, interval selector 326 may select samples from ADC buffer 338 to use for the inferences of trained estimators 328. In some configurations, interval selector 326 may sample digital read signal data from an initial portion of a data sector prior to that data sector being processed by iterative detector 324. For example, ADC buffer 338 may be configured to buffer an initial portion of each data sector that is the measurement portion used for determining noise correction or other parameters. Trained estimators 328, estimate combiner 330, and parameter adjustment logic 332 may determine the noise correction parameters for iterative detector 324 prior to iterative detector 324 processing that data sector.

In some configurations, read write channel 320 may include an iterative detector 324 configured to receive read data from the read heads and use iterative bit detection and ECC processing to decode the received read data into decoded data for further processing by controller firmware and/or communication to the host. For example, iterative detector 324 may include one or more bit detectors 324.1, such as soft output Viterbi algorithm (SOVA) detectors, and one or more iterative decoders 324.2, such as low density parity check (LDPC) decoders operating on multi-bit encoded symbols to decode each sector of data received by read/write channel 320. Iterative detector 324 may receive a digital read signal from ADC 336 in analog front end 334. In some configurations, iterative detector 324 may include one or more parameters for compensating for one or more types of noise in the digital read signal. For example, iterative detector 324 may include noise canceling parameters for jitter, electronic noise, and/or color noise to modify the input waveform signal values to bit detector 324.1.

In some configurations, read/write channel 320 may include a set of logic features for determining the noise canceling parameters based on trained neural network estimators for noise mixture. For example, interval selector 326, trained estimators 328.1-328.*n*, estimate combiner 330, and parameter adjustment logic 332 may enable real-time adjustment of noise canceling parameters in the read channel. In some configurations, interval selector 326 may include logic for determining one or more samples for processing through trained estimators 328. For example, interval selector 326 may be configured with selection logic for selecting several windows of data values from the digital read signal. Each sample may have a predefined sample size, such as 1,000 bits of data, and be selected at fixed or random intervals in a target portion of the read signal data. For example, once ADC buffer 338 has received a set of data values from the read signal corresponding to the measurement portion, interval selector 326 may select at least one set of sample values having the predefined sample size and from a target interval in the measurement portion. Interval selector 326 may pass the selected sets of sample values to respective trained estimators 328.

In some configurations, trained estimators 328.1-328.*n* may comprise deep neural network inference engines configured with node coefficients trained for separating the noise component of the read signal and quantifying the relative mixture of noise types. For example, each trained estimator 328 may be an instance of a previously trained neural network with a node configuration and set of node coefficients trained for noise mixture estimation by estimator training logic 312 during manufacture and/or configuration of the storage device. In some configurations, trained estimators 328 may include a single trained estimator 328.1 configured to process a sample from interval selector 326 and output a set of estimate values for the noise mixture of the selected sample. In some configurations, trained estimators 328 may include two or more trained estimators 328.1-328.*n* that each receive a different sample and output corresponding sets of estimate values. Estimate combiner 330 may include estimate combination logic to combine the different output sets of trained estimators 328 to determine an output set of estimate values for the noise mixture. For example, estimate combiner 330 may average the sets of estimate values from trained estimators 328 to provide an average for each noise type across the number of trained estimators. The resulting output set of estimate values may include a jitter value, an electronic noise value, and one or more color noise values based on averaging the corresponding values from each trained estimator 328.1-328.*n*.

In some configurations, parameter adjustment logic 332 may include logic for converting the set of estimate values from a trained estimator 328.1 or estimate combiner 330 to one or more parameters for adjusting the read channel to compensate for the current noise mixture. For example, parameter adjustment logic 332 may map each noise type estimate and/or the relationships among the noise type estimates to corresponding adjustment values for noise correction to the read signal wave form before it is processed by iterative detector 324. In some embodiments, each noise type may correspond to a different signal noise filter to be applied to the digital read signal and the noise estimate values may each be mapped to one or more tap value parameters for the different signal noise filters. For example, parameter adjustment logic 332 may include a lookup table or transfer function for determining tap value settings from the set of estimate values. In some configurations, the digital read signal may have the parameter adjustments applied prior to being received by bit detector 324.1, such as a SOVA detector. For example, the read path may pass the digital read signal data through a set of noise filters prior to adjust the wave form prior to the iterative processing by bit detector 324.1 to determine bit value likelihoods.

Servo controller 342 may include one or more specialized circuits configured to process servo data, such as position error signals, from the disk surfaces and providing a control signal to position the actuators in a closed-loop control system. Servo controller 342 may also receive commands from processor 304 for positioning operations, such as seek, track follow, load, unload, sweep, idle, and other actuator positioning operations. Servo controller 342 may also implement servo error recovery processes for recovering from servo errors. In some embodiments, servo controller 342 may include servo processor 344 and servo logic 346 (stored in a servo memory). For example, servo processor 344 may be a dedicated processor circuit and servo logic 346 may be firmware stored in RAM associated with the dedicated processor to provide dedicated computing resources for managing the servo functions. Servo controller 342 may receive servo signals read from the disk surface using preamp 322 and provided to servo controller 342. Servo controller 342 may provide servo control signals to motor controller 348 and motor controller 348 may control one or more actuator VCMs and/or a spindle motor for rotating the disk stack.

Figure 4:
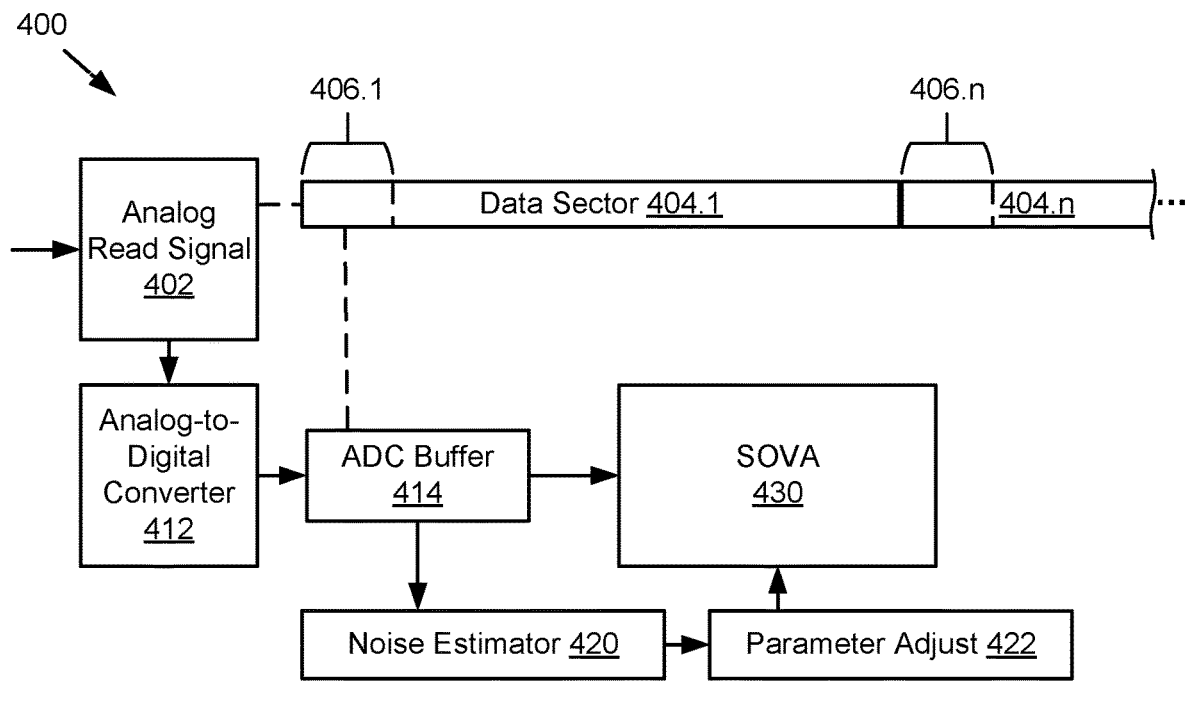
FIG. 4 is a block diagram of a portion of an example channel circuit with real-time parameter adjustment based on a trained neural network noise mixture estimator.

FIG. 4 shows an example configuration of data storage device electronics 400 for a controller and read/write channel configured with trained neural network noise mixture estimators. Data storage device electronics 400 may be configured to receive an analog read signal 402 from a non-volatile storage medium of the data storage device. For example, a read head and preamplifier may generate analog read signal 402 from the magnetic transitions of a rotating disk storage medium. In some configurations, analog read signal 402 may be comprised of a series of data sectors 404.1-404.n corresponding to one or more data tracks on the storage medium. For example, data tracks may be divided into data sectors of a predefined length, such as 512 kilobytes (KBs) or 4096 KBs. In some configurations, analog read signal 402 may pass through one or more analog signal conditioning circuits prior to being received by analog-to-digital converter 412.

ADC 412 may operate substantially as described above regarding ADC 336, receiving analog read signal 402 and sampling analog read signal 402 to generate a corresponding digital read signal comprised of digital signal values at a channel baud rate. For example, ADC 412 may be a 5-bit ADC configured for sampling analog read signal 402 and buffering the digital signal values in ADC buffer 414. ADC buffer 414 may operate substantially as described above regarding ADC buffer 338, temporarily storing a segment of the digital read signal prior to the digital read signal passing to SOVA 430 along the read path. In some configurations, ADC buffer 414 may be a first-in-first-out (FIFO) buffer with a buffer size of at least a measurement portion 406 of data sectors 404. For example, a predefined measurement portion may include one or more 1,000 bit sets of digital sample values. ADC buffer 414 may provide a moving window of data values in the digital read signal from ADC 412 and noise estimator 420 may be configured to read the measurement portion 406.1 in an initial or leading portion of a current data sector 404.1 based on the sector timing.

Noise estimator 420 may operate substantially as described above regarding trained estimators 328 and may include the functions of interval selector 326 and estimate combiner 330. For example, noise estimator 420 may select one or more samples from measurement portion 406 in ADC buffer 414 and process them through one or more instances of a trained neural network. In some configurations, multiple sets of estimate values may be combined into an output set of estimate values. The resulting set of noise estimate values may be passed to parameter adjustment logic 422.

Parameter adjustment logic 422 may operate substantially as described above regarding parameter adjustment logic 332. For example, parameter adjustment logic 422 may map the output set of estimate values from noise estimator 420 to one or more noise correction parameter adjustments for SOVA 430. In some configurations, parameter adjustment logic 422 may adjust parameters, such as noise filter coefficients or tap weights, for the digital signal values from ADC buffer 414 as they are received and/or processed by SOVA 430. SOVA 430 may operate substantially as described above regarding bit detector 324.1.

Figure 5:
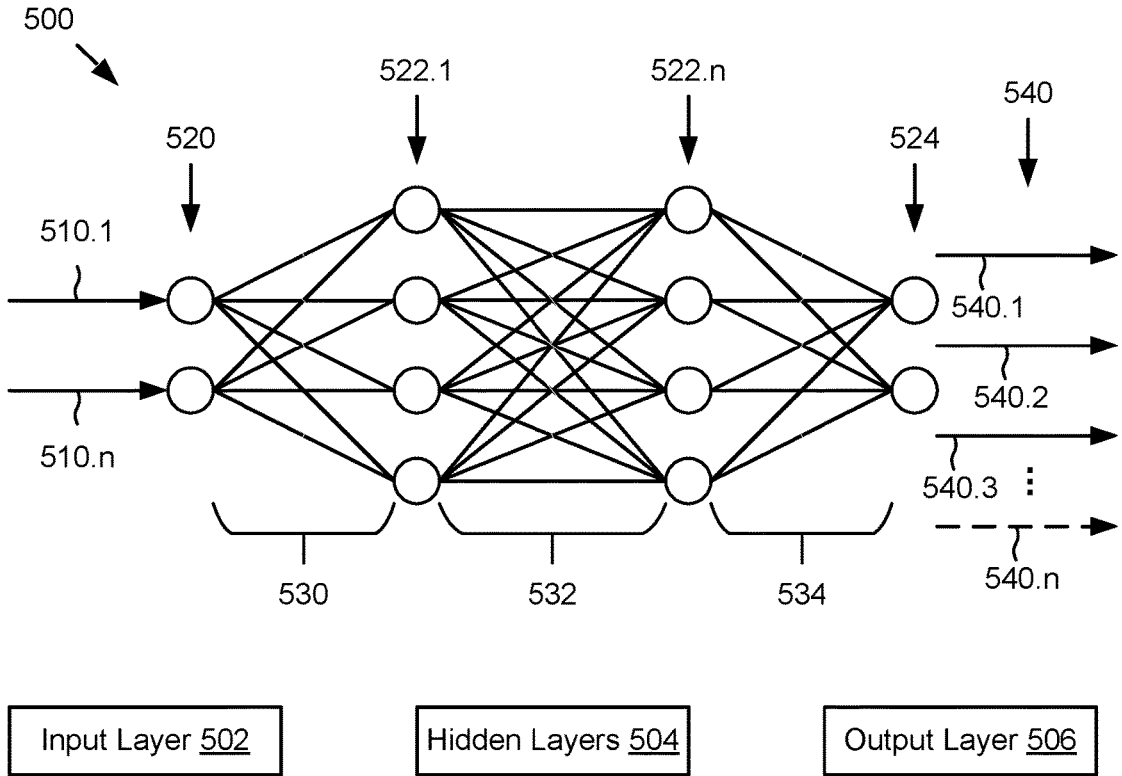
FIG. 5 is a diagram of an example neural network for noise mixture estimators.

FIG. 5 shows an example neural network 500 for noise mixture estimators, such as trained estimators 328 in FIG. 3 and/or noise estimator 420 in FIG. 4. Neural network 500 may include a number of nodes and connections organized in layers. For example, neural network 500 may include an input layer 502, hidden layers 504, and output layer 506. Input layer 502 may include a plurality of nodes 520 configured to receive inputs 510.1-510.n. In the example shown, input layer 502 may include two input nodes 520 configured to each receive an input 510 from the digital read signal. For example, the digital read signal may include a pair of read signals from dual read heads that read the data on the storage medium in parallel. Input 510.1 may be the digital read signal sample from the first read head and input 510.n may be the digital read signal sample from the second head. In some configurations, inputs 510 may include sets of digital samples of a predefined sample size from the digital read signal waveform. For example, unequalized data samples from the read channel ADC may be received as inputs from an ADC buffer.

Neural network 500 may be configured with any number of hidden layers 504. In the example shown, hidden layers 504 include two node layers 522.1 and 522.n and each node layer comprises four nodes. Any number of node layers may be used and more or fewer nodes may be present in each layer, depending on the desired topology of the neural network. Each node layer 522 may be interconnected by a set of connections, such as connections 532. Similarly, connections 530 may connect nodes 522.1 to input nodes 520 and connections 534 may connect nodes 522.n to output nodes 524. Each node may include a non-linear transfer function and a weighting coefficient. In some configurations, weighting coefficients may be separately applied and trained for each connection between node layers.

Neural network 500 may include multiple output nodes 524 configured to output the inference values generated by neural network 500. In the example shown, neural network 500 included two output nodes 524 outputting output values 540. For example, output values 540 may correspond to a set of estimate values for noise mixture and/or other values. In some configurations, output nodes 524 may output a set of estimate values corresponding to different noise types. For example, estimate value 540.1 may be a jitter value, estimate value 540.2 may be an electronic noise value, and estimate value 540.3 may be a color noise value, such as stationary color noise. In some configurations, neural network 500 may be configured to output other values 540.*n* derived from the signal samples, such as a delta signal-to-noise ratio (SNR) between the input samples 510.1 and 510.*n* and their respective readers. In some configurations, other values 540.*n* may include one or more statistics related to the input signals that may be used for adjusting one or more parameter values of the channel. For example, other signal statistics, such as delta SNR, may assist in modifying filter weights, signal equalization, or other parameters for noise correction and improved signal conditioning for the read channel. In some configurations, output values 540 may include the noise mixture percentage, where the value for each noise type adds up to 100% of the noise component of the digital read signal. For example, neural network 500 may separate the noise component from the data component of the input data samples and quantify each noise type as a percentage of the total noise component, such as jitter 80%, electronic noise 10%, and color noise 10% or jitter 50%, electronic noise 30%, and color noise 20%. In some configurations, neural network 500 may output sets of estimate values for direct use by parameter adjustment logic and/or to be averaged across different data samples and instances of neural network 500 for a combined (averaged) set of estimate values for use by the parameter adjustment logic.

Figures 6, 7:
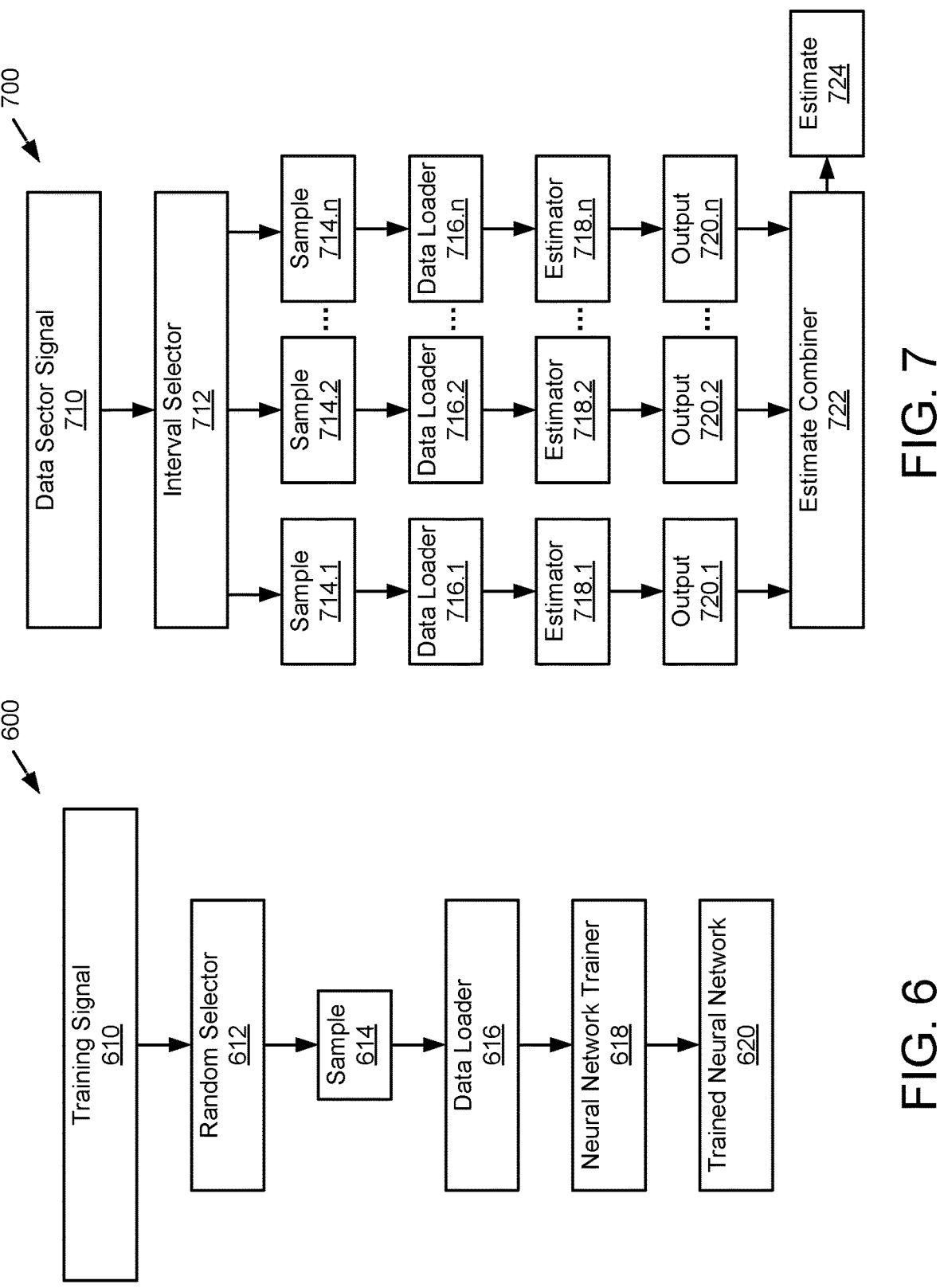
FIG. 6 is a block diagram of an example training system for neural network noise mixture estimators.
FIG. 7 is a block diagram of an example configuration using parallel noise mixture estimators for processing multiple samples.

FIG. 6 shows an example training system 600 for neural network noise mixture estimators, such as the neural network estimators of FIGS. 3-5. In some configurations, training system 600 may be embodied in estimating training logic 312 instantiate in the memory of the data storage device. For example, training system 600 may be loaded in firmware during manufacture or configuration of the data storage device and then removed once the trained instances of the neural network are configured in the read/write channel. In some configurations, training system 600 may be instantiated in a manufacturing or configuration system comprised of a processor and memory outside of the data storage device and connected to the data storage device for at least a portion of the manufacturing or configuration process, including the training of the neural network(s) for noise estimation.

Training system 600 may include a training signal 610 used to train the neural network. For example, training signal 610 may include training data samples with known data and noise components. In some configuration, training signal 610 may be generated from training data written to the storage medium of the data storage device and read using the storage medium and read path of the data storage device to train the neural network to the unique characteristics and environment of the data storage device being trained. For example, training data may be written to at least a portion of the storage medium and have the noise components determined using an alternate technique, such as noise breakdown characterization. Based on prior noise characterization and the known data pattern, separate known noise components and known data components may be known for the training data set. The resulting data on the storage medium may be used to generate training signal 610 and corresponding noise mixture values may be used as training targets in the error calculation and learning algorithm of neural network trainer 618.

In some configurations, training system 600 may include a random selector 612 configured to randomly select samples of a predefined sample size from training signal 610. For example, training system 600 may not use all available training data samples in training signal 610, but randomly select intervals throughout training signal 610 until training conditions are met. In some configurations, random selector 612 may select random intervals from buffered read signal data, such as digital read data in the ADC buffer of the read channel. For example, as training signal 610 is passed through the ADC buffer, random selector 612 may select data samples for each training iteration. Unlike the real-time operations, training samples may be selected from anywhere in the data sector and may or may not be exclusive of data portions included in prior training data samples. Each resulting sample 614 may be used for an iteration of neural network trainer 618.

In some configurations, training system 600 may include a data loader 616 for receiving sample 614 and loading each sample for processing by neural network trainer 618. Neural network trainer 618 may start from the neural network topology and functions selected for the neural network noise mixture estimators and use an iterative training process for a plurality of samples (e.g., sample 614) from training signal 610 to train the node coefficients of the neural network until training exit conditions are met. For example, each sample may be processed through the neural network based on a current set of coefficients to generate one or more error values based on the outputs of the neural network and the known noise mixture values. The error values may be processed through a learning function to iteratively adjust the coefficients in the neural network. One or more sets of conditions based on minimum and/or maximum numbers of samples, error values, confidence thresholds, and/or other factors may be used to determine when training is complete and the set of node coefficients are determined for the neural network. When training is complete, neural network trainer 618 may output trained neural network 620 comprised of the neural network topology, functions, and node coefficients. In some configurations, trained neural network 620 may be stored in the read/write channel of the data storage device to be instantiated in one or more trained neural network estimators for the noise mixture. For example, the read channel may be configured with a noise mixture estimation path that is preconfigured with the neural network topology and functions and stores the node coefficients from trained neural network 620 for use in trained noise estimators for real-time estimation of noise mixture for adjusting read channel parameters.

FIG. 7 shows an example read channel configuration 700 using parallel noise mixture estimators for processing multiple samples to estimate the noise mixture. For example, read channel configuration 700 may be used by read/write channel 320 in FIG. 3 to determine the set of estimate values to be used by parameter adjustment logic 332. In some configurations, data sector signal 710 may correspond to a data sector read from the storage medium of the data storage device and processed through an ADC to generate a digital read signal for the data sector. Interval selector 712 may select a plurality of data sample intervals from data sector signal 710 to process through the parallel noise mixture estimators. For example, interval selector 712 may select a sample 714 from an initial portion of data sector signal 710, where each sample has a predetermined sample size.

Interval selector 712 may be configured to initiate any number of parallel noise mixture estimators and corresponding estimation paths. For example, interval selector 712 may determine three samples 714.1, 714.2, and 714.n for a target data sector and forward them to corresponding data loaders 716.1, 716.2, and 716.n. Data loaders 716 may each support a corresponding instance of neural network estimator 718. For example, the same neural network topology, functions, and node coefficients (e.g., trained neural network 620 in FIG. 6) may be instantiated in estimator 718.1, 718.2, and 718.n. Each estimator 718 may process their respective sample 714 through an instance of the neural network in parallel and independent from one another. Each estimator 718 may generate an output 720 for the data sector. For example, outputs 720.1, 720.2, and 720.n may each include a set of estimate values for the noise mixture, such as a jitter, electronic noise, and color noise value based on their respective samples.

Estimate combiner 722 may be configured to combine outputs 720 to determine estimate 724. For example, estimate combiner 722 may receive outputs 720 and average each of their respective noise types. In the foregoing example outputs, estimate combiner 722 would average the jitter estimate values from each output 720 to determine a combined jitter estimate value, average electronic noise estimate values from each output 720 to determine a combined electronic noise estimate value, and average color noise estimate values from each output 720 to determine a combined color noise estimate value. The resulting estimate 724 may be a set of estimate values comprised of the combined jitter estimate value, the combined electronic noise estimate value, and the combined color noise estimate value.

As shown in FIG. 8, control circuitry 300 may be operated according to an example method of training and using neural network noise mixture estimators to adjust a read channel, i.e., according to the method 800 illustrated by blocks 810-850. In some configurations, blocks 802 may be implemented in estimator training logic in the memory of the data storage device and/or with the support of an external computer system during manufacturing or configuration of the data storage device. In some configurations, blocks 804 may be implemented entirely within control circuitry 300 for real-time adjustment of noise compensation parameters during normal operation of the data storage device.

At block 810, a training data signal may be received. For example, the read channel may receive an analog read signal from previously written training data on the storage medium of the data storage device.

At block 812, the training data signal may be sampled. For example, a random selector may determine an interval of training data with a predefined sample size to use for at least one iteration of neural network training.

At block 814, the neural network may be trained on the samples. For example, a neural network trainer may process each sample from block 812 through the neural network.

At block 816, the training data signal may be processed through the read channel. For example, the read channel may process the training data signal and determine the data patterns.

At block 818, trained coefficients may be determined for the neural network. For example, the neural network trainer may iterate through samples, adjusting node coefficients and determining and evaluating error in the resulting noise estimates (based on predetermined noise values and/or performance of the read channel or components thereof) until training exit conditions are met and a set of node coefficient values are determined for the trained neural network.

At block 820, instances of the trained neural network may be populated. For example, the read channel may include one or more instances of the neural network framework (topology and functions) for noise estimation and each instance may have the node coefficients set and stored by the estimator training logic.

At block 830, samples may be determined for adjusting the noise compensation parameters in the read channel. For example, an interval selector may select one or more sample intervals from a buffered set of digital read signal values to use for determining the noise mixture of a current read operation. In some configurations, blocks 832-838 include additional blocks for determining the samples at block 830.

At block 832, the storage medium of the data storage device is read. For example, a read head, preamplifier, and/or other analog read circuitry may generate an analog read signal from the magnetic transition previously recorded on the storage medium.

At block 834, the analog read signal is received. For example, the controller circuitry of the data storage device may receive the analog read signal through a flex circuit connection to the head actuator assembly and process the analog read signal through one or more analog signal conditioning circuits in an analog front end before passing it to an ADC.

At block 836, a digital read signal may be determined. For example, the ADC may sample the analog read signal to determine a corresponding set of digital read signal values at the baud rate of the read channel.

At block 838, the digital read signal may be buffered. For example, the digital read signal values from block 836 may be written to a FIFO buffer memory for use by other components of the read channel, including sampling at block 830 for determining the noise mixture.

At block 840, samples may be processed through at least one neural network instance. For example, the read channel may be configured with one or more trained neural network noise estimators, such as different instances of the same trained neural network, and the samples may be processed through the trained estimators.

At block 842, estimate values may be output from the neural network instances. For example, each trained estimator may output a set of estimate values corresponding to the mixture of noise types in that sample.

At block 844, read channel parameters may be adjusted. For example, noise correction parameter adjustment logic may determine one or more adjustments to the noise correction parameters based on the set of estimate values from the trained estimator(s) and apply those adjustments to the read channel configuration for processing the digital read signal.

At block 846, data bits may be detected. For example, a bit detector, such as a SOVA detector, may process the digital read signal values adjusted by the noise correction parameters to determine the likelihood of the bit values in the digital read signal.

At block 848, bit patterns may be decoded. For example, an iterative decoder, such as an LDPC decoder, may iteratively decode bit patterns based on soft information from the bit detector to determine stored data units from the digital read signal.

At block 850, stored data units may be output. For example, decoded data units may be passed from the read channel to device firmware and/or a buffer memory for further processing and/or output to a host system.

Figure 9:
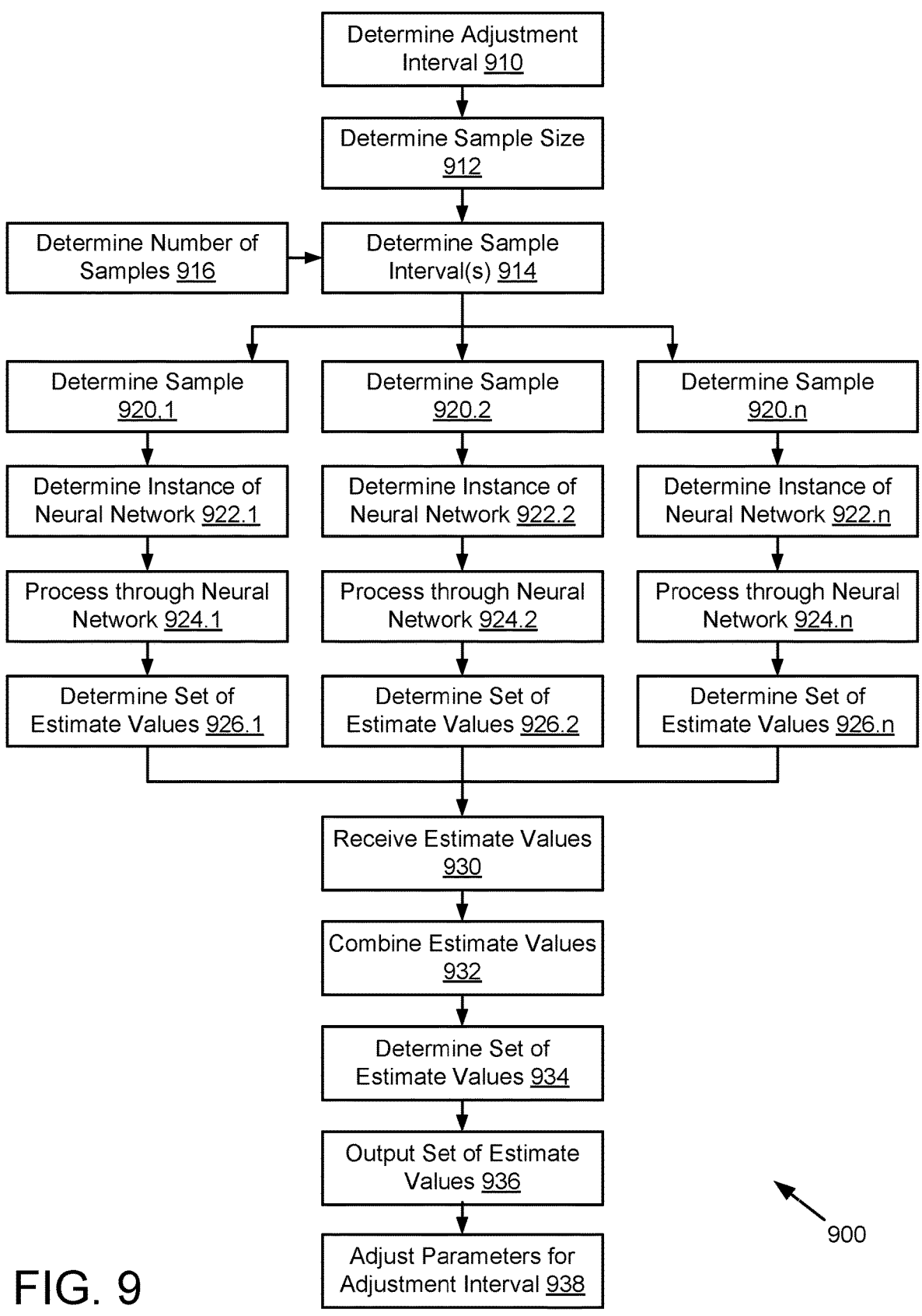
FIG. 9 is an example method of using multiple samples per adjustment interval to determine estimate values and adjust a read channel.

As shown in FIG. 9, control circuitry 300 may be operated according to an example method of using multiple samples per adjustment interval to determine estimate values and adjust a read channel, i.e., according to the method 900 illustrated by blocks 910-938.

At block 910, an adjustment interval may be determined. For example, the data storage device may be configured to periodically determine noise compensation parameters based on time intervals or the formatting of the storage medium, such as each data sector, number of data sectors, each track, or a similar periodic interval.

At block 912, a sample size may be determined. For example, the data storage device may be configured for a sample size, in terms of bits, bytes, or other data segments, used by each estimator.

At block 914, one or more sample intervals may be determined. For example, the data storage device may be configured with selector logic for determining what interval of data from the digital data signal is sampled, such as the initial portion of data in the adjustment interval. In some configurations, a number of samples may be determined at block 918. For example, multiple instances of the neural network noise mixture estimators may be used, such as 2, 3, or more instances, and each instance may receive a different sample for the adjustment interval. This may result in multiple sample intervals being determined at block 914.

Blocks 920-926 may be executed for each instance of the neural network noise estimator in the read channel, such as the paths shown for three different instances in FIG. 9. In some configurations, each sample interval may be selected from an initial portion of the adjustment interval and processing by each instance may be executed in parallel to enable the resulting noise correction adjustments to be made as early in the adjustment interval as possible.

At blocks 920.1, 920.2, and 920.n, samples are determined for each estimator. For example, based on the intervals determined at block 914, different samples may be selected from an ADC buffer for each estimator.

At blocks 922.1, 922.2, and 922.n, an instance of the neural network may be determined. For example, the read channel may be configured with multiple processing paths or threads allocated to the different instances of the trained neural network.

At blocks 924.1, 924.2, and 924.n, the respective samples are processed through the corresponding neural network instance. For example, each trained neural network may process the sample it receives.

At blocks 926.1, 926.2, and 926.n, a set of estimate values may be determined by each neural network instance. For example, each trained neural network may output a different set of estimate values based on the input sample it received.

At block 930, the sets of estimate values may be received. For example, an estimate combiner may receive the output from each of the trained neural networks for the adjustment interval.

At block 932, the sets of estimate values may be combined. For example, the estimate combiner may average each noise type estimate value across the sets of estimate values to combine them.

At block 934, a combined set of estimate values may be determined. For example, the estimate combiner may determine a single, averaged estimate value for each noise type.

At block 936, the combined set of estimate values may be output. For example, the estimate combiner may output the combined set of estimate values to parameter adjustment logic.

At block 938, the noise correction parameters for the read channel may be adjusted for the current adjustment interval. For example, parameter adjustment logic may use the combined set of estimate values to adjust one or more noise filter parameters for the digital read signal being processed by the iterative detector and keep those parameter values until a next adjustment interval.

Technology for using trained neural network noise mixture estimators to adjust read channel parameters in a channel circuit is described above. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to particular hardware.

Reference in the specification to "one embodiment" or "an embodiment" means that a particular feature, structure, or characteristic described in connection with the embodiment is included in at least one embodiment or implementation of the disclosed technologies. The appearances of the phrase "in one embodiment" in various places in the specification are not necessarily all referring to the same embodiment or implementation.

Some portions of the detailed descriptions above may be presented in terms of processes and symbolic representations of operations on data bits within a computer memory. A process can generally be considered a self-consistent sequence of operations leading to a result. The operations may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers, or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), erasable programmable read-only memories (EPROMs), electrically erasable programmable read-only memories (EEPROMs), magnetic or optical cards, flash memories including universal serial bus (USB) keys with non-volatile memory or any type of media suitable for storing electronic instructions, each coupled to a computer system bus.

The disclosed technologies can take the form of an entire hardware implementation, an entire software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The terms storage media, storage device, and data blocks are used interchangeably throughout the present disclosure to refer to the physical media upon which the data is stored.

Finally, the processes and displays presented herein may not be inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description above. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A channel circuit, comprising:
an interval selector configured to determine at least one sample from a digital read signal;
a trained noise estimator configured to:
process the at least one sample through an instance of a neural network comprised of trained coefficients; and
output a set of estimate values corresponding to a noise mixture in the digital read signal; and
adjustment logic configured to adjust at least one parameter of a read channel based on the set of estimate values.

2. The channel circuit of claim 1, wherein the set of estimate values includes estimate values for a plurality of noise types selected from:
jitter;
electronic noise; and
color noise.

3. The channel circuit of claim 1, wherein:
the set of estimate values includes a jitter value, an electronic noise value, and a color noise value; and
combination of the jitter value, the electronic noise value, and the color noise value corresponds to a total noise value.

4. The channel circuit of claim 1, further comprising:
an analog-to-digital converter configured to:
receive an analog read signal determined from a non-volatile storage medium;
determine the digital read signal from the analog read signal; and
buffer the digital read signal to a buffer memory, wherein the interval selector is further configured to determine the at least one sample from the buffer memory.

5. The channel circuit of claim 1, wherein:
the at least one sample determined by the interval selector includes a plurality of samples;
each sample of the plurality of samples is configured with a sample size and a sample interval from the digital read signal;
the trained noise estimator comprises a plurality of instances of the neural network;
each sample of the plurality of samples is processed through a different instance of the plurality of instances of the neural network; and the set of estimate values is based on outputs from the plurality of samples and the plurality of instances of the neural network.

6. The channel circuit of claim 5, further comprising:

estimate combination logic configured to:

receive a corresponding set of estimate values from each sample of the plurality of samples; and determine, based on the corresponding sets of estimate values, the set of estimate values provided to the adjustment logic.

7. The channel circuit of claim 1, further comprising:

an iterative detector configured to:

detect data bits from the digital read signal; and decode detected bit patterns to determine data units stored to a non-volatile storage medium, wherein the at least one parameter of the read channel is configured to adjust values in the digital read signal for processing by the iterative detector.

8. The channel circuit of claim 1, wherein:

the interval selector is further configured to determine the at least one sample for a predefined adjustment interval;

the adjustment logic is further configured to adjust the at least one parameter of the read channel during the predefined adjustment interval; and the predefined adjustment interval is each data sector of a non-volatile storage medium.

9. The channel circuit of claim 1, further comprising:

estimator training logic configured to:

receive a training data signal comprised of known noise components and known data components;

sample the training data signal to determine a set of training samples; and process, using the read channel and a neural network trainer, the set of training samples to determine the trained coefficients by separating a plurality of noise components from data components in the set of training samples.

10. A data storage device comprising the channel circuit of claim 1 and further comprising a non-volatile storage medium configured to store data.

11. A method comprising:

determining at least one sample from a digital read signal;

processing the at least one sample through an instance of a neural network comprised of trained coefficients;

outputting, from the instance of the neural network, a set of estimate values corresponding to a noise mixture in the digital read signal; and adjusting at least one parameter of a read channel based on the set of estimate values.

12. The method of claim 11, wherein the set of estimate values includes estimate values for a plurality of noise types selected from:

jitter;

electronic noise; and color noise.

13. The method of claim 11, wherein:

the set of estimate values includes a jitter value, an electronic noise value, and a color noise value; and combination of the jitter value, the electronic noise value, and the color noise value corresponds to a total noise value.

14. The method of claim 11, further comprising:

receiving, by an analog-to-digital converter, an analog read signal determined from a non-volatile storage medium;

determining, by the analog-to-digital converter, the digital read signal from the analog read signal;

buffering the digital read signal to a buffer memory; and determining the at least one sample from the buffer memory.

15. The method of claim 11, further comprising:

determining a plurality of samples from the digital read signal, wherein each sample of the plurality of samples is configured with a sample size and a sample interval from the digital read signal; and processing each sample of the plurality of samples through a different instance of a plurality of instances of the neural network, wherein the set of estimate values is based on outputs from the plurality of samples and the plurality of instances of the neural network.

16. The method of claim 15, further comprising:

receiving a corresponding set of estimate values from each sample of the plurality of samples; and determining, based on the corresponding sets of estimate values, the set of estimate values used for adjusting the at least one parameter of the read channel.

17. The method of claim 11, further comprising:

detecting, by an iterative detector, data bits from the digital read signal; and decoding, by the iterative detector, detected bit patterns to determine data units stored in a non-volatile storage medium, wherein adjusting the at least one parameter of the read channel includes adjusting values in the digital read signal for processing by the iterative detector.

18. The method of claim 11, further comprising:

determining the at least one sample for a predefined adjustment interval; and adjusting the at least one parameter of the read channel during the predefined adjustment interval, wherein the predefined adjustment interval is each data sector of a non-volatile storage medium.

19. The method of claim 11, further comprising:

receiving a training data signal comprised of known noise components and known data components;

sampling the training data signal to determine a set of training samples; and training, using the read channel and the set of training samples, the neural network to determine the trained coefficients for separating a plurality of noise components from data components in the set of training samples.

20. A data storage device comprising:

a non-volatile storage medium;

a channel circuit including a read channel;

means for determining at least one sample from a digital read signal;

means for processing the at least one sample through an instance of a neural network comprised of trained coefficients;

means for outputting, from the instance of the neural network, a set of estimate values corresponding to a noise mixture in the digital read signal; and means for adjusting at least one parameter of the read channel based on the set of estimate values.

* * * * *